(12) United States Patent
Rohde et al.

(10) Patent No.: US 7,180,381 B2
(45) Date of Patent: Feb. 20, 2007

(54) WIDEBAND VOLTAGE CONTROLLED OSCILLATOR EMPLOYING EVANESCENT MODE COUPLED-RESONATORS

(75) Inventors: Ulrich L. Rohde, Upper Saddle River, NJ (US); Reimund Rebel, Ringwood, NJ (US); Ajay Kumar Poddar, Fairlawn, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 28 days.

(21) Appl. No.: 11/111,009

(22) Filed: Apr. 21, 2005

(65) Prior Publication Data

US 2005/0242896 A1 Nov. 3, 2005

Related U.S. Application Data

(60) Provisional application No. 60/564,173, filed on Apr. 21, 2004.

(51) Int. Cl.
  *H03B 5/18* (2006.01)
(52) U.S. Cl. .................. 331/96; 331/117 D; 331/177 V
(58) Field of Classification Search .................. 331/96, 331/117 R, 117 FE, 117 D, 177 R, 177 V
  See application file for complete search history.

(56) References Cited

U.S. PATENT DOCUMENTS

| | | | |
|---|---|---|---|
| 2,502,488 A | 4/1950 | Shockley | |
| 2,524,035 A | 10/1950 | Bardeen et al. | |
| 3,373,379 A | 3/1968 | Black | |
| 4,435,688 A | 3/1984 | Shinkawa et al. | |
| 4,527,130 A | 7/1985 | Lutteke | |
| 4,619,001 A | 10/1986 | Kane | |
| 4,621,241 A | 11/1986 | Kiser | |
| 4,692,714 A | 9/1987 | Galani | |
| 4,812,784 A | 3/1989 | Chung et al. | |
| 4,868,526 A | 9/1989 | Camiade | |
| 5,041,799 A | 8/1991 | Pirez | |
| 5,231,361 A | 7/1993 | Smith et al. | |
| 5,373,264 A | 12/1994 | Higgins | |
| 5,402,087 A | 3/1995 | Gorczak | |
| 5,650,754 A | 7/1997 | Joshi | |
| 5,661,439 A | 8/1997 | Watkins et al. | |

(Continued)

FOREIGN PATENT DOCUMENTS

DE  3443446 A  5/1986

(Continued)

OTHER PUBLICATIONS

D. Ham, A. Hajimiri, "Concepts and Methods in Optimization of Integrated LCVCOs," IEEE Journal of Solid-state Circuits, Jun. 2001.

(Continued)

*Primary Examiner*—David Mis
(74) *Attorney, Agent, or Firm*—Lerner, David, Littenberg, Krumholz & Mentlik, LLP (57) ABSTRACT

In one aspect, the present invention includes a voltage controlled oscillator comprising an active device having a plurality of resonators coupled across two terminals of the device and at least one resonator coupled across the plurality of resonators. The at least one resonator preferably operates as an evanescent mode buffer capable of storing a select amount of energy present in the oscillator.

25 Claims, 9 Drawing Sheets

U.S. PATENT DOCUMENTS

| | | | |
|---|---|---|---|
| 5,748,051 | A | 5/1998 | Lewis |
| 5,854,578 | A | 12/1998 | Minasi et al. |
| 6,124,767 | A | 9/2000 | Woods |
| 6,297,708 | B1 | 10/2001 | Lemay |
| 6,489,853 | B1 | 12/2002 | Lewis |
| 6,624,726 | B2 | 9/2003 | Niu et al. |
| 6,630,869 | B2 | 10/2003 | Flynn et al. |
| 6,714,088 | B2 | 3/2004 | Chang |
| 6,714,772 | B2 | 3/2004 | Kasahara et al. |
| 6,731,181 | B2 | 5/2004 | Fukayama et al. |
| 6,734,745 | B2 | 5/2004 | Sakai |
| 6,737,928 | B2 | 5/2004 | Kubo et al. |
| 2001/0004225 | A1 | 6/2001 | Nicholls et al. |
| 2001/0035794 | A1 | 11/2001 | Fujidai et al. |
| 2002/0084860 | A1 | 7/2002 | Festag et al. |
| 2003/0160660 | A1 | 8/2003 | Chang et al. |
| 2004/0095197 | A1 | 5/2004 | Wang et al. |
| 2004/0130402 | A1 | 7/2004 | Marquardt |
| 2005/0156683 | A1* | 7/2005 | Rohde et al. ............... 331/185 |
| 2005/0242896 | A1* | 11/2005 | Rohde et al. ............... 331/179 |
| 2005/0280478 | A1* | 12/2005 | Patel et al. ............ 331/107 SL |

FOREIGN PATENT DOCUMENTS

| | | |
|---|---|---|
| EP | 0 475 262 A | 3/1992 |
| EP | 0 800 224 A | 10/1997 |
| EP | 0 843 374 A | 5/1998 |
| EP | 1 093 216 A | 4/2001 |
| JP | 59-139708 A | 8/1964 |
| JP | 59-072205 A | 4/1984 |
| WO | WO-02/17476 A | 2/2002 |
| WO | WO-02/05416 A1 | 11/2002 |

OTHER PUBLICATIONS

E. Hegazi, H. Sjoland, and A. Abidi, "A Filtering Technique to Lower LC Oscillator Phase Noise," IEEE J. Solid-State Circuits, vol. 36, pp. 1921-1929, Dec. 2001.

J. C. Nallatamby, M. Prigent, M. Camiade, J. Obregon, "Phase Noise in Oscillators-Leeson Formula Revisited," IEEE Transactions on Microwave Theory and Techniques, vol. 51, No. 4, pp. 1386-1394, Apr. 2003.

M. Odyniec, Editor, RF and Microwave Oscillator Design, Chapter 3: Linearity, Time Variation, and Oscillator Phase Noise, by T. Lee and A. Hajimiri, Artech House, 2002.

M. Vidmar, "A Wideband, Varactor-Tuned Microstrip VCO," Microwave Journal, Jun. 1999.

H.C. Chang, Phase noise self-injection-locked oscillators- Theory and experiment, IEEE Transactions on Microwave Theory and Techniques, vol. 51, No. 9, pp. 1994-1999, Sep. 2003.

Franz X. Sinnesbichler, Hybrid Millimeter-Wave Push—Push Oscillators using Silicon-Germanium HBTs, IEEE MTT-S, vol. 51, Feb. 2003.

Douglas R. Jachowski, "Passive Enhancement of Resonator Q in Microwave Notch Filters", IEEE MTT-S Digest, pp. 1315-1318, Jun. 2004.

A. K. Poddar, S.K. Koul, and B. Bhat, "Millimeter Wave Evanescent Mode Gunn Diode Oscillator in Suspended Stripline Configuration." 22nd International Conference on Millimeter Waves, pp. 265-266, Jul. 1997.

Henkes, Dale D, 'Designing Short High Q Resonators', Design, Dec. 2003, pp. 75-109.

U.L. Rohde, "A Novel RFIC for UHF Oscillators (Invited)," 2000 IEEE Radio Frequency Integrated Circuits (RFIC) Symposium, Boston, MA, Jun. 11-13, 2000.

Ulrich Rohde, "A New and Efficient Method of Designing Low Noise Microwave Oscillators," PhD Dissertation, Technical University of Berlin, 2004.

U.L. Rohde, D.P. Newkirk, RF/Microwave Circuit Design for Wireless Applications, pp. (123-197; Chapter 5), John Wiley & Sons, Apr. 2000, ISBN 0-471-29818-2.

Wing Shing Chan et al.: "The Design Of Oscillators Using The Cascode Circuit" Circuits and Systems, 1994, vol. 5, pp. 689-692, May 30, 1994.

Franz X. Sinnesbichler, Hybrid Millimeter-Wave Push—Push Oscillators Using Silicon-Germanium HBTs, IEEE MTT-S, vol. 51, Feb. 2003.

S. Kudszus, W. H. Haydi, A. Tessmann, W. Bronner, and M. Schlechteweg, "Push—Push Oscillators for 94 and 140 GHz Applications Using Standard Pseudomorphic GaAs HEMTs," IEEE MTT-S, Microwave Symp. Digest, 2001, pp. 1571-1574.

Y. Baeyens et al., "Compact InP-based HBT VCOs with a Wide Tuning Range at W- and D-Band," IEEE Trans. MTT, vol. 48, pp. 2403-2408, Dec. 2001.

Y. Sun, T. Tieman, H. Pflung, and W. Velthius, "A Fully Integrated Dual-Frequency Push—Push VCO for 5.2 and 5.8 GHz Wireless Applications," Microwave Journal., pp. 64-74, Apr. 2001.

M. Schott, H. Kuhnert, J. Hilsenbeck, J. Wurlf, and H. Heinrich, 38 GHz Push—Push GaAs-HBT MMIC Oscillator, IEEE MTT-S, Digest, 2002, pp. 839-842.

F. X. Sinnesbichler and 0. R. Olbrich, "SiGe HBT Push—Push Oscillators for V-Band Operation," IEEE MTT-S silicon Monolithic Integrated Circuits in RF Systems Symp., Garmisch, Germany, Apr. 26-28, 2000, pp. 55-59.

F. X. Sinnesbichler, H. Geltinger, and G. R. Olbrich, "A 38 0Hz Push—Push Oscillator Based on 25-GHZ fT BJTs," IEEE Microwave Guided Wave Lett. vol. 9 pp. 151-153, Apr. 1999.

K. W. Kobayashi et al., "A 108-GHz InP-HBT Monolithic Push—Push VCO with Low Phase Noise and Wide Tuning Bandwidth," IEEE J. Solid-State Circuits, vol. 34, pp. 1225-1232, Sep. 1999.

L. Dussopt, D. Guillois and 0. Rebeiz, "A Low Phase Noise Silicon 9 GHz VCO and an 18 GHz Push—Push Oscillator," IEEE MTT-S. Digest, 2002, pp. 695-698.

F. X. Sinnesbichler, B. Hauntz and 0. R. Olbrich, "A Si/SiGe HBT Dielectric Resonator Push—Push Oscillators at 58 GHz," IEEE Microwave Guided Wave Lett. vol. 10, pp. 145-147, Apr. 2000.

U. L. Rohde, "A New and Efficient Method of Designing Low Noise Microwave Oscillators," Ph.D. Dissertation, Technical University of Berlin, Feb. 12, 2004.

Mortazawi A and B. C. De Loach, Jr., "Multiple Element Oscillators Utilizing a New Power Combining Technique" in IEEE MTT-S Tnt. Microwave Symp. Dig., 1992, pp. 1093-1096.

B. Van der Pol, The Nonlinear Theory of Electric Oscillations, Proc. IRE, vol. 22 No. 9, pp. 1051-1086, Sep. 1934.

R. Adler, "A Study of Locking Phenomena in Oscillators," Proc. IEEE, vol. 61, pp. 180-1385, Oct. 1973.

D. B. Leeson, "A Simple Model of Feedback Oscillator Noise Spectrum," Proc. IEEE, pp. 329-332, 1966.

Heng-Chia Chang, Xudong Cao, Umesh K. Mishra, and R. York, "Phase Noise in Coupled Oscillators: Theory and experiment," IEEE Trans. MTT, vol. 45, pp. 604-615, May 1997.

Heng-Chia Chang, Xudong Cao, Mark J. Vaughan, Umesh K. Mishra, and R. York,"Phase Noise in Externally Injection-Locked Oscillator Arrays," IEEE Trans. MTT, vol. 45, pp. 2035-2042, Nov. 1997.

Andrea Borgioli, Pochi Yeh, and Robert A. York, "Analysis of Oscillators with External Feedback Loop for Improved Locking Range and Noise Reduction," IEEE Trans. MTT, vol. 47, pp. 1535-1543, Aug. 1999.

Jonathan J. Lynch and Robert A. York, "Synchronization of Oscillators Coupled through Narrow-Band Networks," IEEE Trans. MTT, pp. 238-249, Feb. 2001.

Klaus F. Schunemann and Karl Behm, "Nonlinear Noise Theory for Synchronized Oscillators," IEEE Trans. MTT, vol. 27, pp. 452-458, May 1979.

Kaneyuki Kurokawa, "The Single Cavity Multiple Device Oscillator," IEEE Trans. MTT, vol. 19, pp. 793-801, Oct. 1971.

Kaneyuki Kurokawa, "Noise in Synchronized Oscillators," IEEE Trans. MTT, vol. 16, pp. 234-240, Apr. 1968.

Byeong-Ha Park, "A Low-Voltage, Low-Power, CMOS 900 MHz Frequency Synthesizer," Ph.D. Dissertation, Georgia Institute of Technology, Dec. 1997.

W. O. Schlosser, "Noise in Mutually Synchronized Oscillators," IEEE Trans. Microwave Theory Tech., vol. MTT-16, pp. 732-737, Sep. 1968.

Heng-Chia Chang, "Analysis of Coupled Phase-Locked Loops With Independent Oscillators for Beam Control Active Phased Arrays," IEEE Trans. MTT, vol. 52, pp. 1059-1065, Mar. 2004.

Reidar L. Kuvas, "Noise in Single-Frequency Oscillators and Amplifiers," IEEE Trans. Microwave Theory Tech., vol. MTT-21, pp. 127-134, Mar. 1973.

H. Stark, and J. W. Woods, "Probability, Random Processes, and Estimation Theory for Engineers" New York: Prentice-Hall, 1986.

R. A. York, P. Liao, and J. J. Lynch, "Oscillator Array Dynamics with Broad-Band N-Port Coupling Networks," IEEE Trans. Microwave Theory Tech., vol. 42, pp. 2040-2045, Nov. 1994.

R. A. York, "Nonlinear Analysis of Phase Relationships in Quasi-Optical Oscillator Arrays," IEEE Trans. Microwave Theory Tech., vol. 41, pp. 1799-1809, Oct. 1993.

Shih-Chieh Yen and Tah-Hsiung Chu, "An Nth-Harmonic Oscillator Using an N-Push Coupled Oscillator Array with Voltage-Clamping Circuits", IEEE, MTT-S Digest, pp. 545-548, 1992.

J. R. Bender, C. Wong, "Push—Push Design Extends Bipolar Frequency Range," Microwave & RF, pp. 91-98, Oct. 1983.

Franco Ramirez, Jose Lius Garcia H., Tomas Fernandez and Almudena Suarez, "Nonlinear Simulation Techniques for the Optimized Design of Push—Push Oscillators", IEEE, MTT-S Digest, pp. 2157-2160, 2003.

Jeong-Geun Kim, Dong-Hyun Baek, Sang-Hoon Jeon, Jae-Woo Park and Songcheol Hong,"A 60 GHz InGaP/GaAs HBT Push—Push MMIC VCO," IEEE, MTT-S Digest, pp. 885-888, 2003.

F. X. Sinnesbichler, B. Hautz, G. R. Olbrich, A Low Phase Noise 58 GHz SiGe HBT Push—Push Oscillator with Simultaneous 29 GHz Output, IEEE, MTT-S Digest, pp. 35-38, 2000.

Hai Xiao, Takayuki Tanka and Masayoshi Aikawa, "A Ka-Band Quadruple-Push Oscillator", IEEE, MTT-S Digest, pp. 889-892, 2003.

R. G. Freitag, S.H. Lee, D.M. Krafcsik, D.E. Dawson and J. E. Degenford, Stability and Improved Circuit Modeling Considerations for High Power MMIC Amplifiers, IEEE, MM-Wave Monolithic Circuits Symposium, pp. 2169-2172, 2003.

J. Heinbockel and A. Mortazawi, "A Periodic Spatial Power Combining MESFET Oscillator", IEEE, MTT-S Digest, pp. 545-548, 1992.

M. Kuramitsu and F. Takasi, "Analytical method for Multimode Oscillators Using the Averaged Potential," Elec. Communication Japan, vol. 66-A, pp. 10-19, 1983.

Ronald G. Freitag, "A Unified Analysis of MMIC Power Amplifier Stability," IEEE, MTT-S Digest, pp. 297-300, 1992.

Shigeji Nogi, Jenshan Lin and Tatsuo Itoh., "Mode Analysis and Stabilization of a Spatial Power Combining Array with Strongly Coupled oscillators," IEEE, MTT, vol. 41, pp. 1827-1837, Oct. 1993.

Amir Mortazawi, Heinrich D. Foltz, and Tatsuo Itoh, "A Periodic Second Harmonic Spatial Power Combining Oscillator", IEEE, MTT, vol. 40, pp. 851-856, May 1992.

Jonathan J. Lynch and Robert A. York,"An Analysis of Mode-Locked Arrays of Automatic Level Control Oscillators," IEEE Trans. on Circuits and Systems-I, vol. 41, pp. 859-865, Dec. 1994.

R. A. York and R.C. Compton, "Mode-Locked Oscillator Arrays", IEEE Microwave and Guided Letter, vol. 1, pp. 215-218, Aug. 1991.

Yu-Lung Tang and Huei Wang, "Triple-Push Oscillator Approach: Theory and Experiments," IEEE- JSS, vol.36, pp. 1472-1479, Oct. 2001.

J. Everard, "Fundamentals of RF Circuit Design with Low Noise Oscillators," John Wiley & Sons. Ltd, 2001.

U.L. Rohde, "Improved Noise Modeling of GaAs FETS: Using an Enhanced Equivalent Circuit Technique," Microwave Journal, pp. 87-101—Nov. 1991.

WA. Pucel, W. Struble, R Hallgren, U.L. Rohde, "A General Noise De-embedding Procedure for Packaged Two-Port Linear Active Devices," IEEE Transactions on MTT, vol. 40, No. 11, pp. 2013-2024, Nov. 1992.

U.L. Rohde, "Parameter Extraction for Large Signal Noise Models and Simulation of Noise in Large Signal Circuits Like Mixers and Oscillators," 23rd European Microwave Conference, Madrid, Spain, Sep. 6-9, 1993.

C. Arnaud, D. Basataud, J. Nebus, J. Teyssier, J. Villotte, D. Floriot, "An Active Pulsed RF and Pulsed DC Load-Pull System for the Characterization of HBT Power Amplifiers Used in Coherent Radar and Communication Systems," IEEE Transactions of Mfl, vol. 48, No. 12, pp. 2625-2629, Dec. 2000.

F.M. Ghannouchi, R. Larose, R.G. Bosisio, "A New Multiharmonic Loading Method for Large-Signal Microwave and Millimeter-Wave Transistor Characterization," IEEE Transactions on MTT, vol. 39, No. 6, pp. 986-992, Jun. 1991.

H. Abe, Y. Aono, "11 GHz GaAs Power MESFET Load-Pull Measurements Utilizing a New Method of Determining Tuner Y-Parameters," IEEE Transactions on Microwave Theory and Techniques, vol. 27, No. 5, pp. 394-399, May 1979.

Q. Cai, J. Gerber, S. Peng, "A Systematic Scheme for Power Amplifier Design Using a Multi-Harmonic Load-Pull Simulation Technique," 1998 IEEE MTT-S Symposium Digest, vol. 1, pp. 161-165, Jun. 7-12, 1998.

P. Berini, M. Desgagne, F.M. Ghannouchi, R.G. Bosisio, "An Experimental Study of the Effects of Harmonic Loading on Microwave MESFET Oscillators and Amplifiers," IEEE Transactions on MTT, vol. 42, No. 6, pp. 943-950, Jun. 1994.

A. M. Elsayed and M. I. Elmasry, Low-Phase-Noise LC Quadrature VCO using Coupled Tank Resonators in Ring, IEEE, JSSC, vol. 36, pp. 701-705, Apr. 2001.

M. Ticbout, "Low power, Low Phase Noise, Differentially Tuned Quadrature VCO Design in Standard CMOS," IEEE- JSSS, vol. 36, pp. 10 18-1024, Jul. 2001.

K.O, "Estimation Methods for Quality Factors of Inductors Fabricated in Silicon Integrated Circuit Process Technologies," IEEE, JSSS, pp. 1565-1567, Sep. 1997.

A.V. Grebennikov, "Microwave Transistor Oscillators: an Analytic Approach to Simplify Computer-Aided Design", Microwave Journal, pp. 294-299, May 1999.

Andrew V. Grebennikov, "Microwave FET Oscillators: an Analytic Approach to Simplify Computer-Aided Design", Microwave journal, pp. 102-111, Jan. 2000.

Jwo-Shiun Sun, "Design And Analysis of Microwave Varactor-Tuned Oscillators", Microwave journal, pp. 302-308, May 1999.

M. Regis, O. Llopis, and J. Graffeuil, "Nonlinear Modelling and Design of Bipolar Transistor Ultra Low Phase-Noise Dielectric-Resonator Oscillators", IEEE transaction on MTT, vol. 46, No. 10, pp. 1589-1593, Oct. 1998.

R. J. Hawkins, "Limitations of Nielsen's and Related Noise Equations Applied to Microwave Bipolar Transistors and a New Expression for the Frequency and Current Dependent Noise Figure," Solid-State Electron, vol. 20 pp. 191-196, 1977.

T. H. Hsu and C.P. Snapp, "Low-Noise Microwave Bipolar Transistor with Sub-Half-Micrometer Emitter Width," IEEE Trans. Electron Devices, vol. ED-25, pp. 723-730, Jun. 1978.

U. L. Rohde, K. Juergen Schoepf, A.K. Poddar, "Low Noise VCOs Conquer Wide Bands," Microwaves & RF, pp. 98-106, Jun. 2004.

A. K. Poddar and K. N. Pandey, "Microwave Switch using MEMS technology," 8th IEEE International Symposium, EDMO-2000, pp. 134-139, Nov. 2000, UK.

A. Ward and B. Ward, "A Comparison of various Bipolar Transistor Biasing Circuits," Applied Microwave & Wireless, vol. 13, pp. 30-52, 2001.

U. L. Rohde, A. K. Poddar, Juergen Schoepf, Reimund Rebel, and Parimal Patel, "Low Noise Low Cost Ultra Wideband N-Push VCO," IEEE, IMS Symposium, MTT2005, USA.

* cited by examiner

WIDEBAND VOLTAGE CONTROLLED OSCILLATOR EMPLOYING EVANESCENT MODE COUPLED-RESONATORS

CROSS-REFERENCE TO RELATED APPLICATIONS

This application claims the benefit of the filing date of U.S. Provisional Patent Application No. 60/564,173, filed Apr. 21, 2004, the disclosure of which is hereby incorporated herein by reference.

BACKGROUND OF THE INVENTION

A voltage controlled oscillator (VCO) or oscillator is a component that can be used to translate DC voltage into a radio frequency (RF) voltage or signal. In general, VCOs are designed to produce an oscillating signal at a particular frequency 'f' that corresponds to a given tuning voltage. In particular, the frequency of the oscillating signal is dependent upon the magnitude of a tuning voltage $V_{tune}$ applied to a tuning diode network across a resonator circuit. The frequency 'f' may be varied from $f_{min}$ to $f_{max}$ and these limits are referred as the tuning range or bandwidth of the VCO. The tuning sensitivity of the VCO is defined as the change in frequency over the tuning voltage and it is desirable to tune the VCO over a wide frequency range within a small tuning voltage range.

The popularity of mobile telephones has renewed interest and generated more attention in wireless architectures. This popularity has further spawned renewed interest in the design of low noise wideband oscillators. The recent explosive growth in the new families of cellular telephones and base stations using universal mobile telephone systems (UMTS) has stirred a need for developing an ultra-low noise oscillator with a fairly wide tuning range. The demands of wideband sources have generally increased telescopically because of the explosive growth of wireless communications. In particular, modern communication systems are typically multi-band and multi-mode, therefore requiring a wideband low noise source that preferably allows simultaneous access to DCS 1800, PCS 1900 and WCDMA (wideband code division multiple access) networks by a single wideband VCO.

The magnitude of the output signal from a VCO depends on the design of the VCO circuit and the frequency of operation is in part determined by a resonator that provides an input signal. Clock generation and clock recovery circuits typically use VCOs within a phase locked loop (PLL) to either generate a clock from an external reference or from an incoming data stream. VCOs are often critical to the performance of PLLs. In turn, PLLs are generally considered essential components in communication networking as the generated clock signal is typically used to either transmit or recover the underlying service information so that the information can be used for its intended purpose. PLLs are particularly important in wireless networks as they enable communications equipment to lock-on to the carrier frequency onto which communications are transmitted relatively quickly.

The dynamic operating range and noise performance of a VCO may limit or affect the performance of the PLL itself, which in turn may affect the performance of the device in which the PLL is employed, e.g., RF transceivers, cell phone, modem card, etc. Broadband tunability of VCOs represents one of the more fundamental tradeoffs in the design of a VCO, impacting both the technology and the topology used. The dynamic time average quality factor (i.e., Q-factor) of the resonator as well as the tuning diode noise contribution affect the noise performance of a VCO. Furthermore, the dynamic loaded Q is, in general, inversely proportional to the operating frequency range of the VCO.

Despite the continuous improvement in VCO technology, low phase noise typically remains a bottleneck and poses a challenge to RF transceiver (transmitter—receiver) design. This is typically considered due to the more demanding parameters of the VCO design: low phase noise, low power consumption and a wide frequency tuning range.

In LC-resonator based VCOs, phase noise and power consumption typically depend primarily on the time average loaded Q-factor of the resonator circuit and the non-linearities associated with the tuning network, which typically employs varactors. The frequency tuning range is determined by the usable capacitive tuning ratio of the varactor and parasitic associated with the tuning network because the parasitic deteriorates and limits the effective tuning capability of the varactor at a high frequency. As the loss-resistance of the tuning network (e.g., varactor and resonator) determines the quality factor, attention is usually paid to the resistive behavior. The frequency range over which a coupled resonator circuit can be tuned by means of the tuning diode depends on the useful capacitance ratio of the tuning diode and on the parallel and series capacitance present in the circuit.

As the frequency for wireless communication shifts to higher and higher frequency bands, generation of an ultra-low noise, wideband, thermally stable and compact signal source at a relatively low cost becomes more and more challenging due to the frequency limitations of the active devices and broadband tunability of the tuning diode. In the past, wide tuning range and good phase noise performance were generally considered to be opposing requirements due to the problem of the controlling the loop parameters and the dynamic loaded Q of the resonator over the range of wideband operation.

For a varactor-tuned oscillator to be continuously tuned over a wide frequency range, the tuning diode should typically exhibit a large change in capacitance in response to a small change in the tuning voltage. However, this usually allows the tuning diode's own capacitance to be modulated by random electronic noise signals that are generated internally by various oscillator circuit elements, including the tuning diode itself. The tuning range of the oscillator generally influences the phase noise and typically there is a trade-off between the continuous tuning range of VCOs and the amount of phase noise generated by the varactor capacitance modulation. On the other hand, the requirements for low noise performance over the complete frequency range are typically demanding.

Thus, there exists a need for methods and circuitry for improving the phase noise performance over a wide tuning frequency range, typically more than an octave-band tuning range.

SUMMARY OF THE INVENTION

An aspect of the present invention is an oscillator preferably comprising an active device having first, second and third terminals, a plurality of resonators coupled across the first and second terminals of the active device and at least one additional resonator capacitively coupled across the plurality of resonators, the at least one additional resonator being operable as an evanescent mode buffer that is capable of storing a select amount of radio frequency energy present in the oscillator.

Further in accordance with this aspect of the present invention, the active device preferably comprises a transistor and the first terminal, second terminal and third terminal of the active device each respectively comprise the base, collector and emitter of the transistor.

Most preferably, the plurality of resonators are capacitively coupled across the base and collector of the transistor. Further still, it is desirable to have a first resonator of the plurality of resonators inductively coupled to a second resonator of the plurality of resonators.

Further in accordance with this aspect of the present invention, the oscillator desirably includes tuning circuitry coupled across the plurality of resonators for adjusting an output frequency of the oscillator and wherein the tuning circuitry and plurality of resonators are capacitively coupled across the first and second terminals such that a negative resistance associated with the active device adjusts in response to adjustments of the tuning circuitry.

Further still, the tuning diode is preferably operable as a tuning capacitor that adjusts the operating frequency of the oscillator over a frequency band.

The resonators may be desirably implemented as microstrip line resonators. In addition, resonators in other mediums, including strip line, Fin line or other equivalent media may be used when implementing the resonators. Further still, the resonators and oscillator may be implemented as an integrated circuit.

Further still, the resonator may comprise part of an integrated circuit formed using Roger or FR4materials.

Further in accordance with this aspect of the present invention, a noise filter is coupled to the third terminal of the active device.

In another aspect, the present invention is a voltage controlled oscillator preferably comprising a transistor having base, collector and emitter terminals; a plurality of resonators capacitively coupled across the base and collector terminals of the transistor, at least one resonator of the plurality of resonators operating as an evanescent mode buffer to store a portion of the energy present in the oscillator; and tuning circuitry coupled across the base and collector terminals of the transistor, the tuning circuitry being operable to tune the negative resistance associated with the transistor.

Further in accordance with this aspect of the present invention, the voltage controlled oscillator further preferably comprises a dynamically tunable noise filter coupled to the emitter terminal of the active device. Most preferably, the dynamically tunable noise filter comprises a lumped RC filter having a variable capacitor.

Further in accordance with this aspect of the present invention, the plurality of resonators are dynamically capacitively coupled across the base and collector terminals of the transistor such that as the tuning circuitry is adjusted the negative resistance at the base and collector terminals is desirably kept substantially uniform.

The transistor may comprise a bipolar transistor, as well as MOSFET or GaASFET device.

Further in accordance with this aspect of the present invention, a Schottky diode may be desirably coupled across the base and collector of the transistor. In addition, the voltage controlled oscillator may further desirably include a tuning filter coupled to the collector, the tuning filter having a rejection band that is dynamically tunable in response to tuning of the tuning circuitry.

In another aspect, the present invention may comprise a telephone. The telephone preferably comprises a phase lock loop for generating a clock signal used to transmit or recover information signals communicated by the telephone, the phase lock loop comprising a voltage controlled oscillator for generating the clock signal. The voltage controlled oscillator preferably comprises a transistor having base, collector and emitter terminals; a plurality of resonators capacitively coupled across the base and collector terminals of the transistor, at least one resonator of the plurality of resonators operating as an evanescent mode buffer to store a portion of the energy present in the oscillator; and tuning circuitry coupled across the base and collector terminals of the transistor, the tuning circuitry being operable to maintain a substantially uniform negative resistance over a tuning band of the voltage controlled oscillator.

In accordance with a further aspect of the present invention, a voltage-controlled oscillator comprising a device having a first terminal, a second terminal and a third terminal and evanescent mode coupled resonator circuitry coupled across the first and second terminals of the device is provided. The oscillator further desirably includes tuning circuitry integrated across the evanescent mode coupled resonator circuitry and noise feedback DC-bias circuitry coupled across the first and second terminals of the device. In accordance with the aspect of the present invention, the frequency of a signal present at the second terminal of the device is changed by tuning the tuning circuitry.

Further in accordance with this aspect of the present invention, noise-filtering circuitry may be coupled to the third terminal of the device. Most preferably, the noise-filtering circuitry comprises an RC lumped filter.

In addition, the oscillator may further desirably include a tracking filter coupled between the third terminal and the tuning circuitry.

It is further preferable to capacitively couple the evanescent mode resonator circuitry across the first and second terminals of the device. Most preferably, the tuning circuitry is inductively coupled to the evanescent mode resonator circuitry.

A further aspect of the present invention is an oscillator that preferably comprises an active circuit element that includes an input and an output. The oscillator may also preferably comprise means for feeding back a select amount of phase noise appearing at the output of the active circuit element into the input of the active circuit element and a resonator circuit coupled across the input and output of the active circuit element. The resonator circuit is preferably operable to determine a frequency of oscillation associated with an output signal appearing at the output of the active circuit element. In addition, the oscillator may also desirably include circuitry coupled across the resonator circuit, such circuitry being preferably operative to store excess energy coupled into the resonator circuit for a given period of a cycle associated with the output signal.

Further in accordance with this aspect of the present invention, the oscillator may desirably comprise a tuning circuit coupled across the resonator circuit. Most preferably, the tuning circuit is operative to tune the frequency of oscillation associated with the output signal.

Further still, the tuning circuitry desirably tunes the frequency of oscillation associated with the output signal while keeping a negative resistance associated with the input and output of the active circuit element uniform.

Further in accordance with this aspect of the present invention, the oscillator may further comprise a filter coupled to the output of the active circuit element, and wherein a rejection ratio associated with the filter is tuned as a voltage associated with the tuning circuit is adjusted.

Further in accordance with this aspect of the present invention, the resonator circuit may be desirably coupled to the active circuit element through a pair of variable capacitors parallely coupled across the input and output of the active circuit element.

Other aspects of the present invention include support of a uniform negative resistance over a wideband frequency range. In addition, the configuration may be further extended in a coupled ring form to extend the frequency of operation in an N-push/push-push approach.

DETAILED DESCRIPTION

Figure 1:
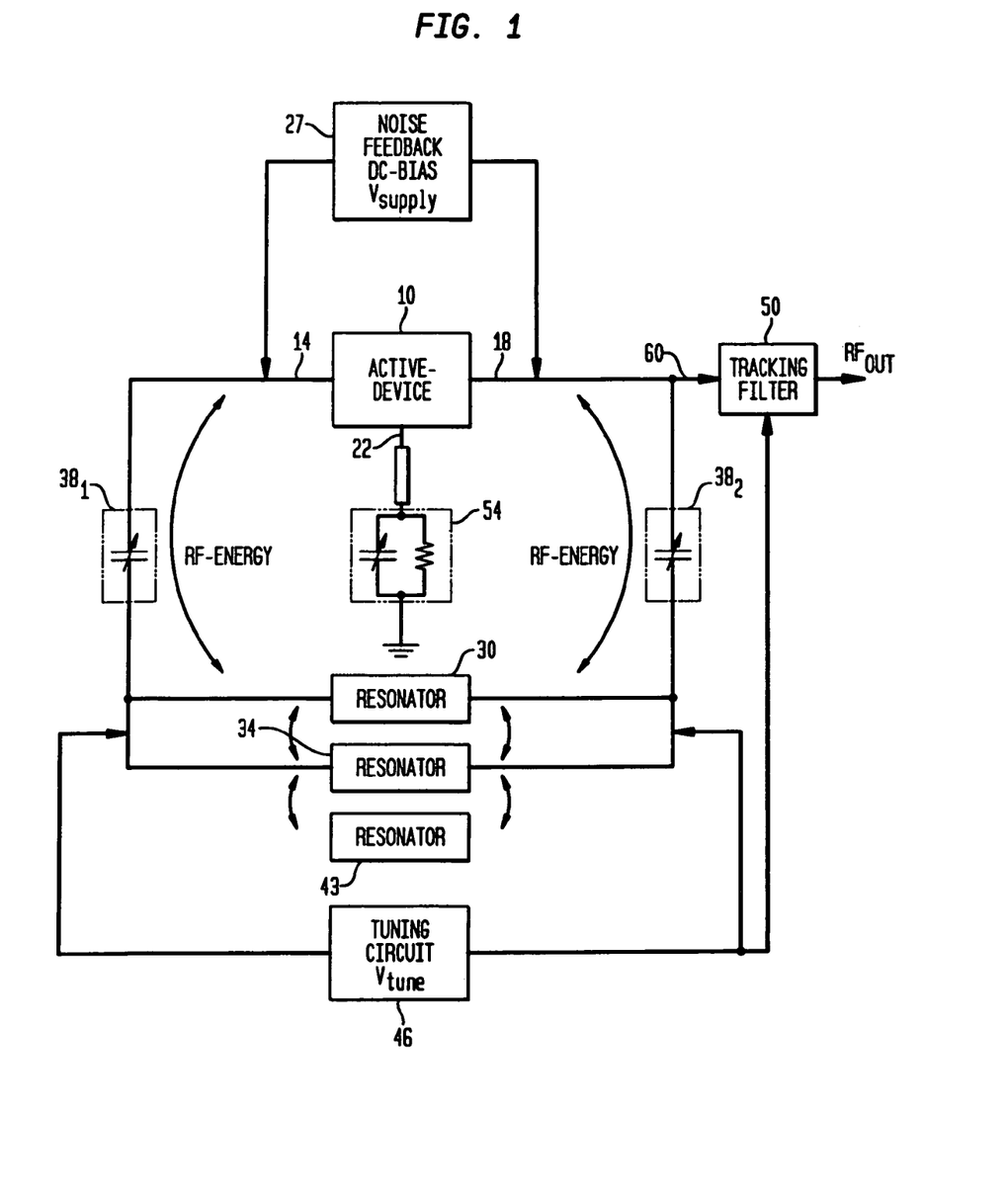
FIG. 1 is a diagram functionally illustrating an oscillator in accordance with an aspect of the present invention.

FIG. 1 is a block diagram illustrating a voltage controlled oscillator (VCO) 1 in accordance with an aspect of the present invention. Voltage controlled oscillator 1 includes an active device 10 having first, second and third terminals, 14, 18 and 22, respectively. Active device 10 may comprise a transistor element wherein the first, second and third terminals, 14, 18 and 22, respectively comprise the base, collector and emitter terminals of the transistor element. More specifically, active device 10 may comprise a bipolar or FET transistor, including any MOS or GaAs active three terminal device. Active device 10 may also include any three terminal device that is operable to provide a 180 degree phase shift between at least two terminals of the device.

Noise feedback and DC-bias circuitry 27 is coupled between the first and second terminals, 14 and 18. Noise feedback and DC bias circuitry 27 supplies a DC voltage to the device 10 and feeds back a select amount of phase noise from the second terminal 18 into the first terminal 14. A pair of resonators 30, 34 is capacitively coupled across the first and second terminals, 14 and 18, through coupling capacitors, $38_1$ and $38_2$. Resonators 30, 34 are inductively coupled to each other and form a resonator network, which may be augmented to include additional resonators. Another resonator 43 is capacitively coupled to resonator 34. As is discussed in further detail below, resonator 43 acts as an evanescent mode (EM) buffer, which stores a portion of the excess radio frequency (RF) energy coupled into the resonator network for a given period of a signal cycle so that the conduction angle of the device 10 can be reduced, thereby reducing the average noise performance for a given period of time.

A tuning circuit 46 is coupled across the inductively coupled resonator network formed by resonators 30, 34. Tuning circuit 46 operates as a variable capacitor thereby improving the loaded Q factor due to the evanescent phenomena of resonator 43. The oscillator 1 also includes a tracking filter 50 coupled to the second terminal 18 and a filter 54 coupled to the third terminal 22. An RF output signal of the oscillator 1 is available at the second terminal 18.

In operation the oscillator 1 operates as follows. A DC voltage is applied through noise feedback and DC-bias circuitry 27 to properly bias the active device 10. A portion of the phase noise from the second terminal 18 is fed back into the active device 10 via circuitry 27 to cause an oscillation condition. This results in an output signal 60 being generated at the second terminal 18 of the device 10. The capacitance associated with the coupling capacitors 38 is then electronically tuned by applying a tuning voltage via tuning circuit 46. As the tuning voltage is adjusted the frequency of the output signal, i.e., the oscillation frequency, is also adjusted and may be adjusted for at least an octave band in accordance with an aspect of the present invention. In turn, the negative resistance at terminals 14 and 18 adjusts in response to the change in oscillation frequency and is kept generally uniform over the tuning band. In addition, as the tuning voltage is adjusted the rejection band associated with the noise filter 54 is adjusted thereby filtering the phase noise contents over the operating frequency band. Further, a rejection band associated with the tracking filter 50 is also dynamically adjusted in response to a change in the tuning voltage.

The dynamically tuned coupling capacitors 38 and dynamically tuned noise filter 54 control the drive levels, conduction angle and phase noise contents over the operating frequency band. The coupled resonator is provided with an evanescent mode buffer for increasing the time average dynamic loaded Q of the coupled resonators across the operating frequency band. As discussed above, the evanescent mode buffer desirably stores a portion of the excess RF energy pumped into the resonator network for a given period of a signal cycle so that the conduction angle of the active device can be reduced, thereby reducing the average noise flow for a given time period.

Parameters associated with the coupled resonators 30, 34, as well as other circuit components, are chosen so that an input signal of a select frequency is generated by the coupled resonators and applied to the active device 10. The frequency band associated with the output signal 60 may be defined by a user by adjusting the length and spacing of the coupled-resonators. In addition, although FIG. 1 shows one active device or oscillator, this approach may be extended to the push-push or N-push approach as is discussed in commonly assigned U.S. application Ser. Nos. 10/912,209 and 11/007,879, the disclosures of which are hereby incorporated herein by reference in their entirety.

Figure 2:
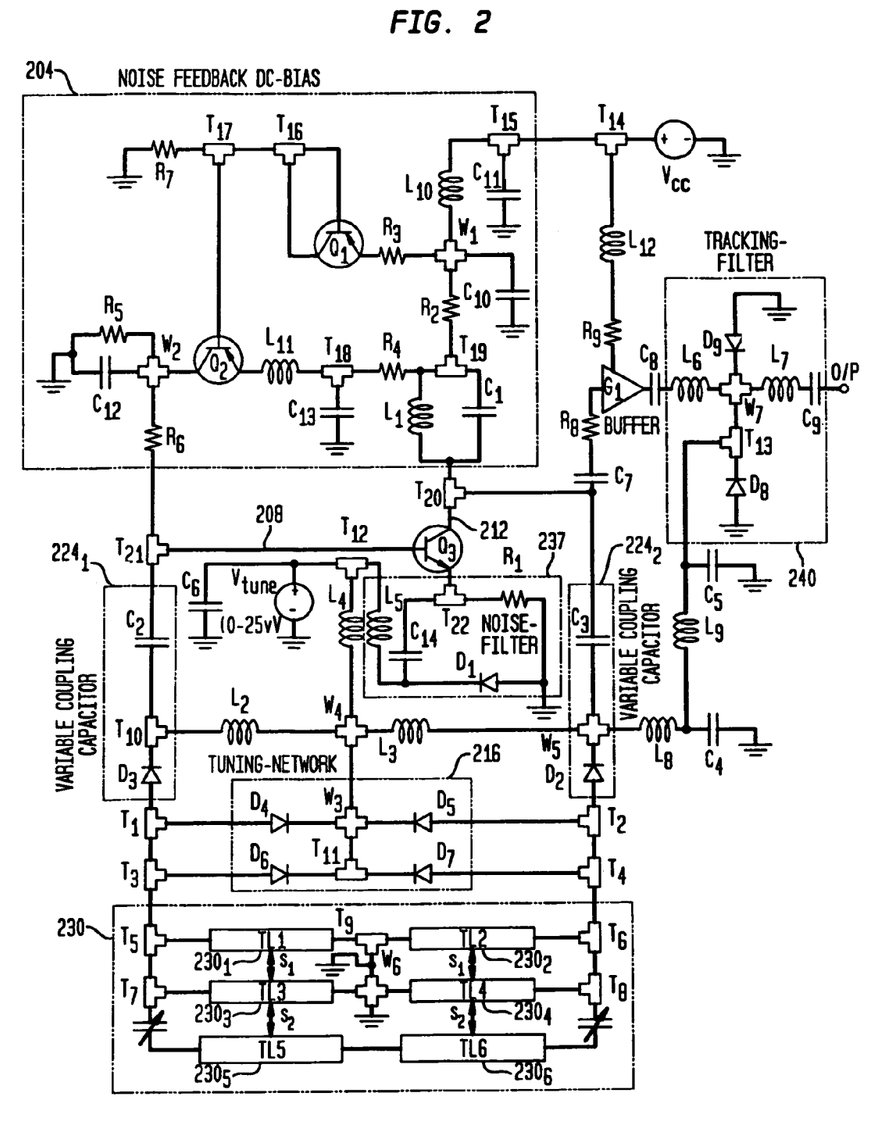
FIG. 2 is a circuit diagram in accordance with an aspect of the present invention.

FIG. 2 depicts a circuit diagram of an oscillator 200 in accordance with an aspect of the present invention. In principle, the oscillator 200 operates in accordance with the description of FIG. 1 above. In FIG. 2, each symbol labeled with a T is a T-connector and each symbol labeled with a W is a four-way connector. In addition, these symbols depict the same connectors in the other figures, where applicable.

As shown in FIG. 2, the oscillator 200 comprises a bipolar transistor Q3 having a noise feedback and DC-bias network 204 coupled across its base 208 and collector 212. A voltage supply Vcc provides a bias voltage to the collector 212 to forward bias the transistor Q3. A tuning network 216 is also coupled across the base 208 and collector 212 of the transistor Q3 through a pair of variable coupling capacitors $224_1$ and $224_2$. The coupling capacitors 224 are formed by the diodes D2, D3 and capacitors C3, C2 in the arrangement shown. A tuning voltage $V_{tune}$ is applied to the tuning network 216 and noise filter 237 through respective inductors L4 and L5.

The coupled resonators $230_1$, $230_2$, $230_3$ and $230_4$ are connected to the transistor Q3 through the coupling capacitors 224 as shown. The evanescent mode buffer is formed by resonators $230_5$ and $230_6$, which are capacitively coupled to the coupled resonators $230_1$, $230_2$, $230_3$ and $230_4$. An output signal (O/P) is provided through a tracking filter 240. As is discussed above, the values selected for the resistors, capacitors, inductors, diodes and other discrete elements in combination with the number, length and spacing of resonators that form the coupled resonator may be used to select the oscillation frequency and operating bands of the oscillators described and claimed herein.

Figure 3:
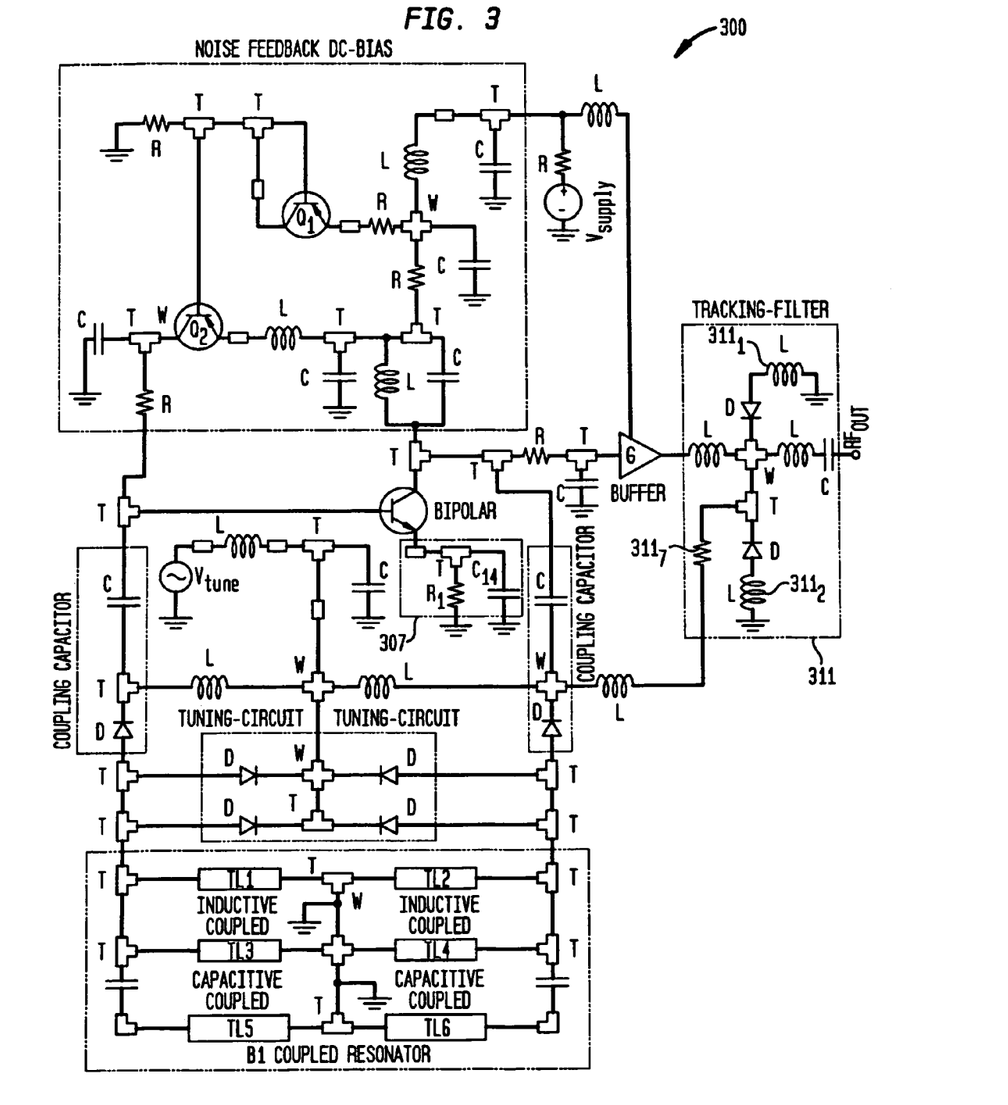
FIG. 3 is a circuit diagram in accordance with an aspect of the present invention.

FIG. 3 illustratively depicts a circuit diagram of an additional oscillator 300 in accordance with an additional aspect of the present invention. The oscillator 300 is a variant of the oscillator 200 and operates in accordance with FIG. 1 as described above. More particularly, the noise filter 307 differs from noise filter 237 of oscillator 200 as it does not include a diode between resistor $R_1$ and capacitor $C_{14}$. In addition, the tracking filter 311 includes inductors $311_1$ and $311_2$ as well as resistor $311_7$.

Figure 4:
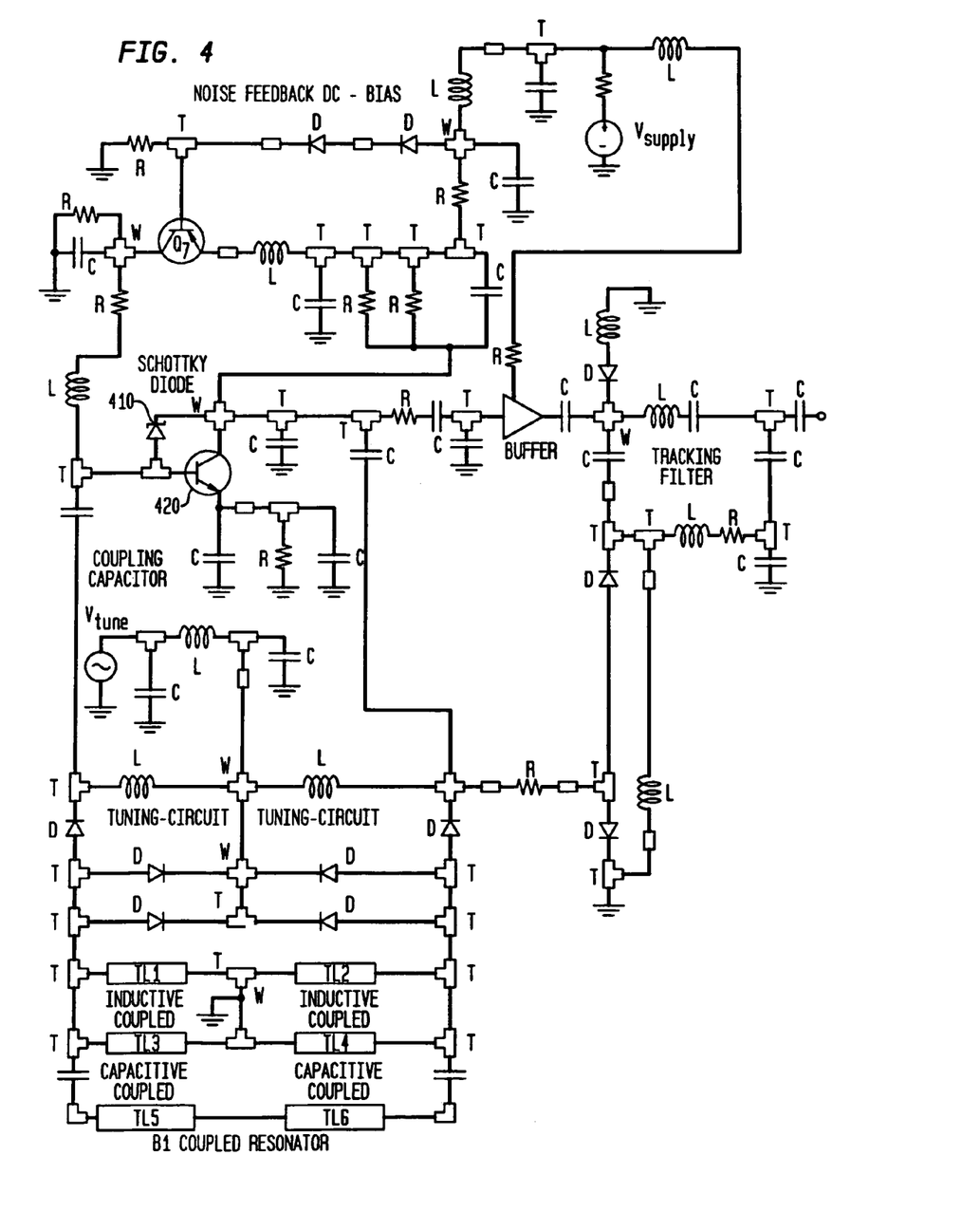
FIG. 4 is a circuit diagram in accordance with an aspect of the present invention.

FIG. 4 is a circuit diagram of oscillator 400 in accordance with an additional aspect of the present invention. In particular, whereas the noise feedback DC-bias shown in the FIG. 3 comprises two PNP transistors, in FIG. 4 one PNP transistor is replaced by two diodes in series for improved noise performance due to correlation of the noise signals. A Schottky diode 410 is placed across the base and collector of the transistor 420, which results in the noise performance being improved by 4–6 dB. A dynamically tracking filter at the output improves the harmonic rejection better than 30 dB over the wideband of operations. The Schottky diode coupled across the base and collector of the transistor is effective when the transistor operates close to the saturation region, which corresponds to the optimum conduction angle for improved phase noise at a particular frequency. Thus, in a further aspect of the present invention a wideband VCO topology is provided that supports phase noise performance comparable to a narrowband VCO by incorporating a Schottky diode as shown, for example, in FIG. 4.

Figure 5:
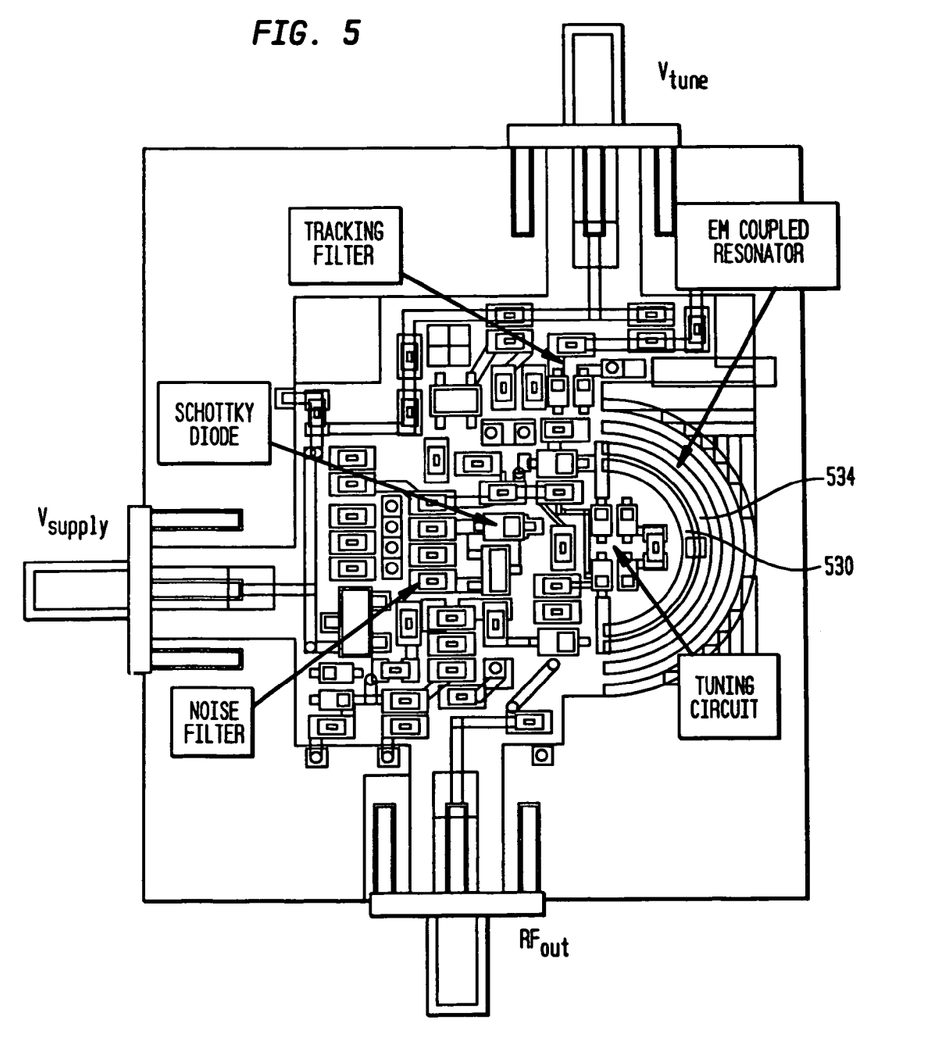
FIG. 5 is a schematic of an integrated circuit in accordance with an aspect of the present invention.

Turning now to FIG. 5, there is shown a schematic diagram of an oscillator 500 in accordance with a further aspect of the present invention. As shown, the oscillator 500 is implemented as an integrated circuit. The integrated circuit may be implemented using FR4, Roger or other suitable materials. The oscillator 500 is an implementation of the circuit diagram of FIG. 4. As shown, the coupled resonators are formed by a pair of micro-strip line resonators 530, 534. The EM buffer is formed by another micro-strip line resonator 543 that is spaced apart from the coupled resonators and acts as storage for excess RF energy that may develop during operation of the oscillator. The curvature and layout of the resonators provide for improved phase performance in accordance with the foregoing discussions.

Figure 6:
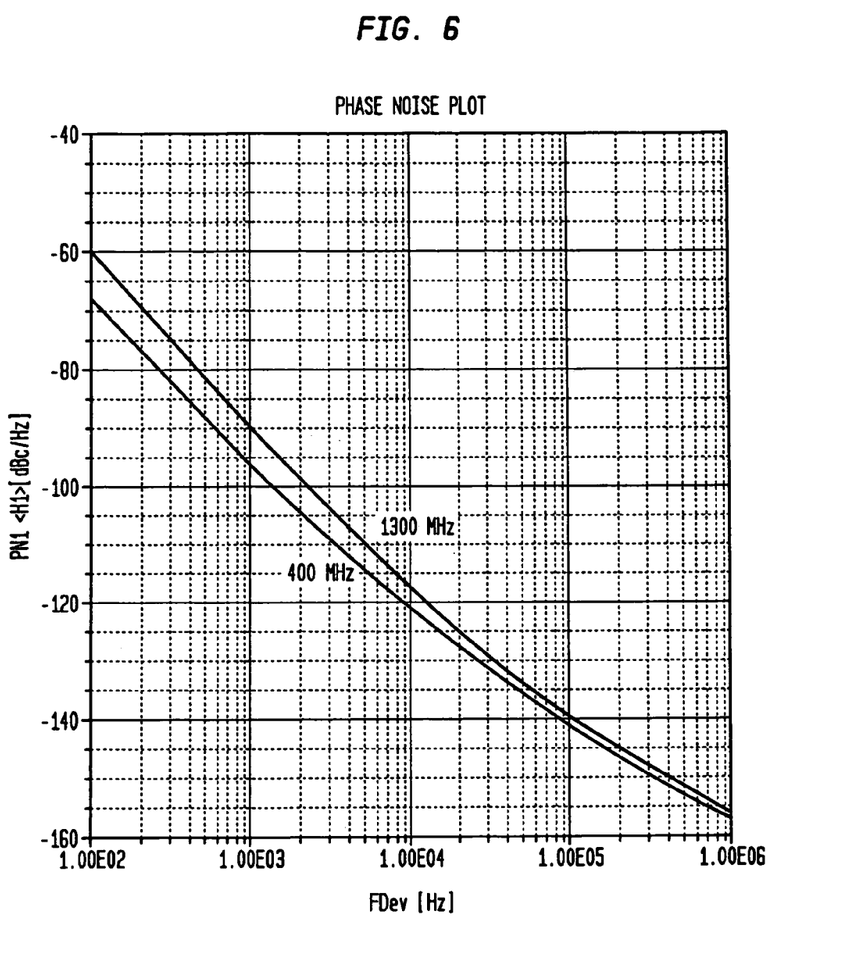
FIG. 6 illustrates a phase plot of an oscillator in accordance with an aspect of the present invention.
Figure 7:
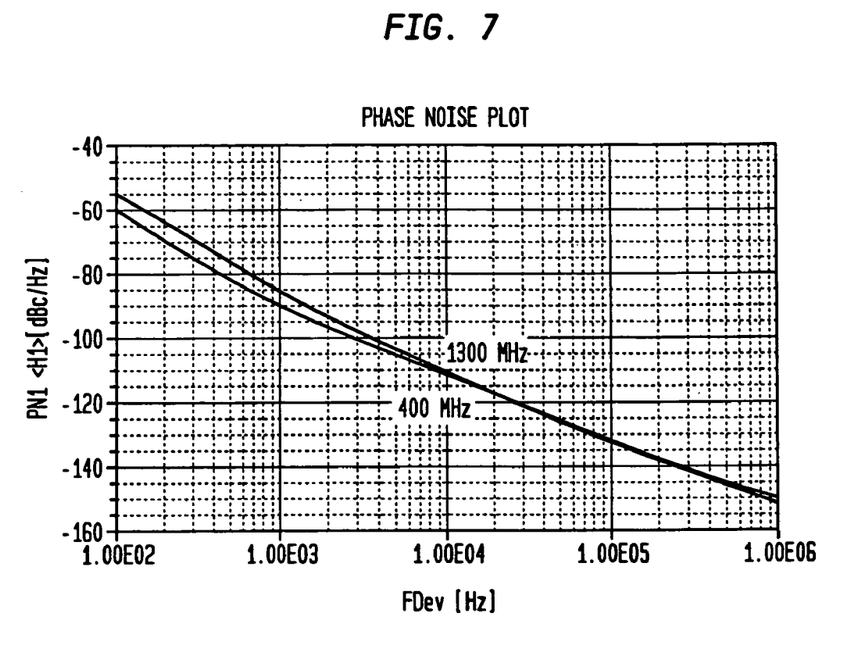
FIG. 7 illustrates a phase plot of an oscillator in accordance with an aspect of the present invention.

FIGS. 6 through 9 illustrate phase noise plots of oscillators implemented in accordance with various aspects of the present invention. In particular, FIG. 6 shows a phase noise plot of a VCO implemented in accordance with the circuit diagram of FIG. 2. As shown, the oscillator is tunable over a range of 400 MHz to 1.3 GHz with a phase noise of –116 dBc/Hz at 10 Khz and –137 dBc/Hz at 100 KHz. FIG. 7 shows an oscillator implemented in accordance with FIG. 3, which is tunable over a range of 400 MHz to 1.3 GHz with a phase noise of –110 dBc/Hz at 10 Khz.

Figure 8:
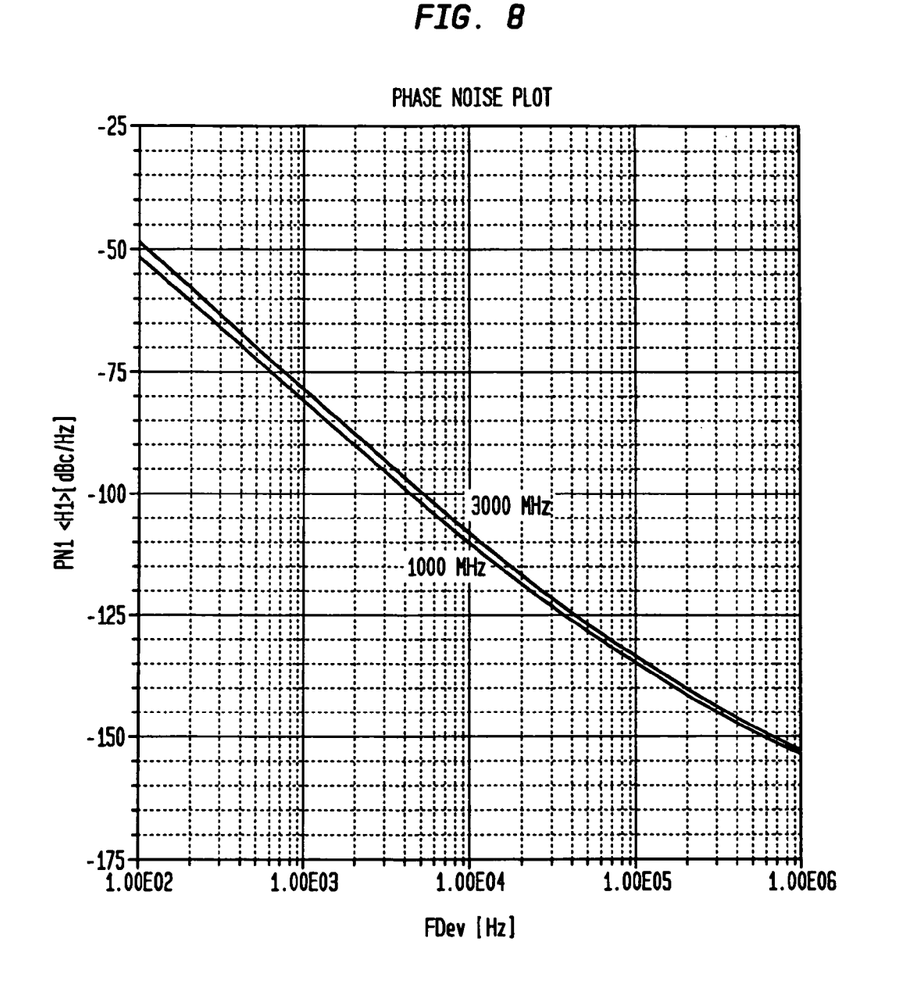
FIG. 8 illustrates a phase plot of an oscillator in accordance with an aspect of the present invention.
Figure 9:
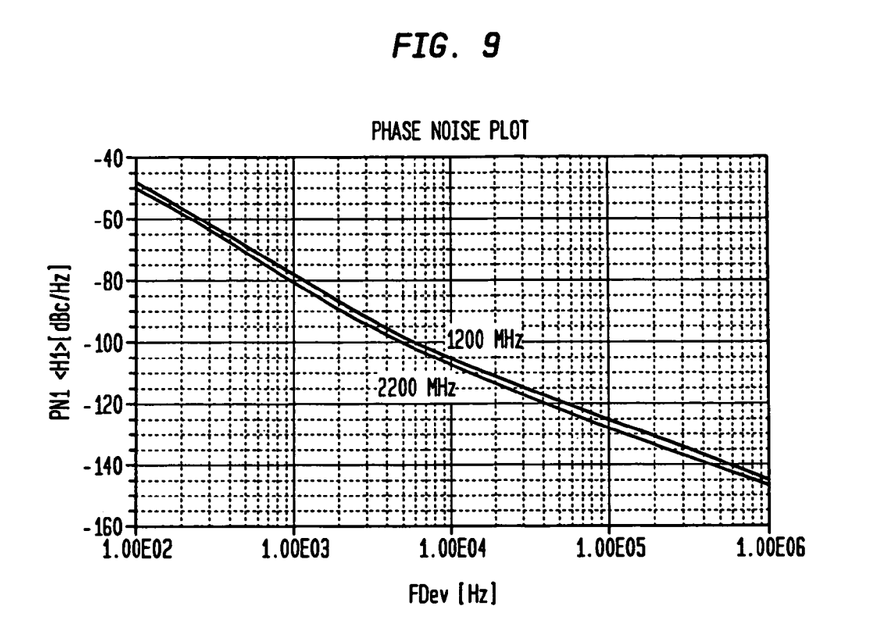
FIG. 9 illustrates a phase plot of an oscillator in accordance with an aspect of the present invention.

FIG. 8 shows a phase noise plot of a VCO implemented in accordance with the circuit diagram of FIG. 2. This oscillator is tunable over a range of 1 GHz to 3 GHz with a phase noise of –108 dBc/Hz at 10 Khz. FIG. 9 shows an oscillator implemented in accordance with FIG. 3, which is tunable over a range of 1.2 GHz to 2.3 GHz with a phase noise of –105 dBc/Hz at 10 Khz.

The foregoing oscillators shown in FIGS. 1 through 5 support steep phase characteristics (rate of change of phase with respect to the frequency: $d\phi/d\omega$; where $d\phi$ and $d\omega$ are defined as change in phase and frequency) by improving group delay at resonance frequency. Thus, in accordance with an aspect of the present invention a wideband voltage controlled oscillator with a lumped LC resonator across the base and collector of a three terminal negative resistance generating device may be implemented in accordance with FIG. 1 and as shown in FIGS. 2–5.

In one aspect, the present invention provides an ultra low noise, relatively low cost and power efficient wideband VCO that can be tuned to operate over a fairly wide range of frequencies while maintaining a relatively low phase noise over the tuning band. In another aspect the present invention is a method for increasing the tuning bandwidth and improving the phase noise in a voltage controlled oscillator of a type that employs an EM (Evanescent Mode) coupled resonator integrated with a varactor diode or other semiconductor device as a tuning element. In view of the limitations of known microwave active devices and resonators for wideband operation, in another aspect the present invention provides a different topology, which supports more than octave-band tunability in a compact size that is amenable for implementation in the integrated chip form.

In accordance with a further aspect of the present invention, the circuit topology and layout of the resonator are preferably selected in such a way that they support uniform negative resistance over a fairly wide frequency band and the microstripline resonator is replaced by an EM coupled resonator thereby producing a relatively high time average loaded Q in the resonator circuit. The EM coupled resonator is preferably connected through a coupling capacitor between a base and a collector of a three terminal active-device and the negative resistance adjusts in response to the change in the oscillator frequency over the frequency band. In that way, the phase shift of a negative resistance-generating network is dynamically tuned to meet the phase shift criteria for resonance over the operating frequency band of interest.

The noise performance optionally may be improved over the wideband by appropriately choosing the spacing between the EM coupled resonators. Further optimization of phase noise is accomplished by incorporating noise feedback DC-bias and noise filtering at the emitter. By doing so, the control parameters such as negative resistance, loop gain and phase shift can be adjusted so as to improve the phase noise performance over the operating frequency band. In accordance with this aspect of the present invention, such phase noise improvement may be achieved using any three terminal active device.

In accordance with an additional aspect of the present invention, the EM coupled resonator advantageously provides a multi-octave band voltage controlled oscillator that is amenable integrated circuit form. In addition, the noise performance over an operating temperature range of –40° C.

to +90° C. may be maintained throughout the octave band of operation and the structure of the layout remains the same for the other higher frequency band.

In accordance with another aspect of the invention, a method for reducing the phase noise of the wideband VCO in the frequency range of 400–1300 MHz and 1000–3000 MHz is provided. Furthermore, the freedom of selection of the frequency band, compact size, low cost, low power consumption, and stability over temperature range make this topology advantageously adaptable for mobile communication applications, such those described in relation to wireless phones, personal digital assistants, laptops or any other portable device.

An EM coupled resonator may be connected across a base and a collector of a three terminal device through a coupling capacitor that is electronically tuned by applying a tuning voltage to a tuning network integrated with an EM coupled resonator. An additional feature and advantage of this topology is the provision of a user definable frequency band that may be achieved by adjusting the length and spacing of the coupled-resonators. These and other advantages are achieved through the use of one or more resonant circuit branches, which include two or more coupled resonators with a tuning diode network incorporated across the coupled resonator circuit.

Accordingly, one aspect of the present invention includes circuitry for a voltage controlled oscillator comprising an evanescent mode coupled resonator coupled across a first terminal and a second terminal of a three terminal device that is electronically tuned by applying a tuning voltage to a tuning network integrated with the evanescent mode coupled resonator. In a further aspect, a method for adjusting the tuning range of an oscillator over a wide frequency band while maintaining low phase noise performance includes capacitively coupling an evanescent mode resonator between the base and collector of a three terminal active-device such that the negative resistance adjusts in response to a change in the oscillator frequency, incorporating a noise feedback DC-bias circuitry at the emitter of the three terminal device and filtering the noise at the emitter of the three terminal device.

A microstripline coupled-resonator in accordance with an aspect of the present invention with which the above and other advantages can be accomplished may be characterized as an evanescent mode buffer, which improves the time average loaded Q of the integrated resonator with the tuning diode network over wideband operation.

In accordance with a further aspect of the present invention, the oscillator may be constructed such that the integrated EM coupled resonator is employed in place of the conventional LC or microstripline resonator circuitry and the phase shift is adjusted by varying the tuning diode across the base and collector.

In accordance with a further aspect of the present invention, wideband tunability is provided through a tuning network, which can support more than octave band tunability without degradation of the loaded Q of the resonator circuit. Another aspect of the present invention allows a voltage to be tuned over both a wide range for the purpose of coarse frequency tuning and over a narrow range for purpose of frequency fine-tuning.

In yet another aspect, the present invention advantageously provides a cost effective, power efficient (5 V, 15 mA), ultra low phase noise (better than −116 dBc/Hz @ 10 KHz and −137 dBc/Hz @ 100 KHz offset for the frequency band 400-1300 MHz) voltage controlled oscillator that is integration in chip form.

In yet another aspect, an oscillator implemented in accordance with the present invention typically may be employed where ultra low phase noise performance is desired. In particular, whether the medium is discrete or integrated, the Colpitts class of resonant oscillators has been generally used for ultra low noise applications. While the topology can take a number of forms, a defining characteristic of a Colpitts oscillator is a capacitive voltage divider that provides positive feedback around an active gain module. Colpitts oscillator circuits have empirically been recognized as offering good phase noise performance. The noise performance of a Colpitts is generally attributed to the discontinuous conduction of the active device, which is controlled by the conduction angle and timed via a feedback network such that current is only supplied to the resonator network during a portion of the period when the oscillator phase is not easily perturbed. Nevertheless, the Colpitts configuration does not generally support wideband tunability and if the base of the active gain device, e.g., transistor, is grounded for fairly broadband operation, it typically results in poor phase noise performance over the frequency band (more than octave band). In another configuration, a resonator may be placed across the collector and base of a transistor and used to dynamically tune the negative resistance as well as the phase of the circuit to meet the oscillator stability criteria over the entire frequency band. A drawback of this topology is the resulting low impedance at higher frequencies. In addition, because of poor isolation between the energy storage network (resonator) and the power supply that eventually generates low frequency modulations, the phase noise deteriorates at lower frequencies in addition to the sidebands. These problems may be overcome in accordance with a further aspect of the present invention by adjusting the phase along the loop of the noise feedback bias circuitry and providing filtering circuitry at the emitter of the transistor as is discussed above and shown in the accompanying drawings.

A voltage controlled oscillator implemented in accordance with the present invention may be employed in any number of devices that are used to communicate on data, telephone, cellular or, in general, communications network. Such devices may include but are not limited to, for example, cellular phones, personal digital assistants, modem cards, lap tops, satellite telephones or RF transceivers. As a general matter, the oscillator circuitry shown in the various drawings and described above may be employed in a PLL to either generate a clock signal that may be used to transmit or recover information transmitted or received over a network. In addition to wireless networks, the circuitry of the present invention may be employed in wired networks, satellite networks, etc.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An oscillator, comprising:
an active device having first, second and third terminals; and
a plurality of resonators coupled across the first and second terminals of the active device and at least one additional resonator capacitively coupled across the plurality of resonators, the at least one additional resonator being operable as an evanescent mode buffer capable of storing a select amount of radio frequency energy present in the oscillator.

2. The oscillator of claim 1, wherein the active device comprises a transistor and the first terminal, second terminal and third terminal of the active device each respectively comprise the base, collector and emitter of the transistor.

3. The oscillator of claim 2, wherein the plurality of resonators are capacitively coupled across the base and collector of the transistor.

4. The oscillator of claim 2, wherein a first resonator of the plurality of resonators is inductively coupled to a second resonator of the plurality of resonators.

5. The oscillator of claim 1, further comprising tuning circuitry coupled across the plurality of resonators for adjusting an output frequency of the oscillator and wherein the tuning circuitry and plurality of resonators are capacitively coupled across the first and second terminals such that a negative resistance associated with the active device adjusts in response to adjustments of the tuning circuitry.

6. The oscillator of claim 1, further comprising a tuning diode coupled across the plurality of resonators and operable as a tuning capacitor to adjust the operating frequency of the oscillator over a frequency band.

7. The oscillator of claim 1, further comprising a feedback and bias circuit coupled across the first and second terminals of the active device and operable to feedback a select amount of phase into the active device in response to tuning of a tuning diode coupled across the plurality of resonators and first and second terminals of the active device.

8. The oscillator of claim 1, wherein the plurality of resonators are selected from the group consisting of a micro-strip line, strip-line and Fin line resonators.

9. The oscillator of claim 8, wherein the micro-strip line resonators comprise part of an integrated circuit.

10. The oscillator of claim 1, further comprising a noise filter coupled to the third terminal of the active device.

11. A voltage controlled oscillator, comprising:
a transistor having base, collector and emitter terminals;
a plurality of resonators capacitively coupled across the base and collector terminals of the transistor, at least one resonator of the plurality of resonators operating as an evanescent mode buffer to store a portion of the energy present in the oscillator; and
tuning circuitry coupled across the base and collector terminals of the transistor, the tuning circuitry being operable to tune a negative resistance associated with the transistor.

12. The voltage controlled oscillator of claim 11, further comprising a dynamically tunable noise filter coupled to the emitter terminal.

13. The voltage controlled oscillator of claim 12, wherein the dynamically tunable noise filter comprises a lumped RC filter having a variable capacitor.

14. The voltage controlled oscillator of claim 11, wherein the plurality of resonators are dynamically capacitively coupled across the base and collector terminals of the transistor such that as the tuning circuitry is adjusted the negative resistance at the base and collector terminals is kept substantially uniform.

15. The voltage controlled oscillator of claim 11, wherein the transistor is a device selected from the group consisting of bipolar, MOSFET and GaAsFET active three terminal devices.

16. The voltage controlled oscillator of claim 11, further comprising a Schottky diode coupled across the base and collector of the transistor.

17. The voltage controlled oscillator of claim 15, further comprising circuitry coupled in parallel with the Schottky diode across the base and. collector of the transistor.

18. The voltage controlled oscillator of claim 11, further comprising a tuning filter coupled to the collector, the tuning filter having a rejection band that is dynamically tunable in response to tuning of the tuning circuitry.

19. The voltage controlled oscillator of claim 11, wherein the at least one resonator of the plurality is capacitively coupled to the other resonators that form the plurality of the resonators.

20. A telephone, comprising:
a phase lock loop for generating a clock signal used to transmit or recover information signals communicated by the telephone, the phase lock loop comprising a voltage controlled oscillator for generating the clock signal, the voltage controlled oscillator comprising:
a transistor having base, collector and emitter terminals;
a plurality of resonators capacitively coupled across the base and collector terminals of the transistor, at least one resonator of the plurality of resonators operating as an evanescent mode buffer to store a portion of the energy present in the oscillator; and
tuning circuitry coupled across the base and collector terminals of the transistor, the tuning circuitry being operable to maintain a substantially uniform negative resistance over a tuning band of the voltage controlled oscillator.

21. An oscillator, comprising:
an active circuit element having an input and an output;
means for feeding back a select amount of phase noise appearing at the output of the active circuit element into the input of the active circuit element;
a resonator circuit coupled across the input and output of the active circuit element, the resonator circuit being operative to determine a frequency of oscillation associated with an output signal appearing at the output of the active circuit element; and
circuitry coupled across the resonator circuit, the circuitry being operative to store excess energy coupled into the resonator circuit for a given period of a cycle associated with the output signal.

22. The oscillator of claim 21, further comprising a tuning circuit coupled across the resonator circuit and operative to tune the frequency of oscillation associated with the output signal.

23. The oscillator of claim 22, wherein the tuning circuit tunes the frequency of oscillation associated with the output signal while keeping a negative resistance associated with the input and output of the active circuit element uniform.

24. The oscillator of claim 22, further comprising a filter coupled to the output of the active circuit element, wherein a rejection ratio associated with the filter is tuned as a voltage associated with the tuning circuit is adjusted.

25. The oscillator of claim 21, wherein the resonator circuit is coupled to the active circuit element through a pair of variable capacitors parallely coupled across the input and output of the active element.

* * * * *

UNITED STATES PATENT AND TRADEMARK OFFICE
CERTIFICATE OF CORRECTION

PATENT NO. : 7,180,381 B2
APPLICATION NO. : 11/111009
DATED : February 20, 2007
INVENTOR(S) : Ulrich L. Rohde, Ajay Kumar Poddar and Reimund Rebel It is certified that error appears in the above-identified patent and that said Letters Patent is hereby corrected as shown below:

Column 9, line 66, after "is" add -- amenable to --.

Signed and Sealed this

Eighteenth Day of December, 2007

JON W. DUDAS
*Director of the United States Patent and Trademark Office*